(12) United States Patent
Goodwin et al.

(10) Patent No.: US 9,030,668 B2
(45) Date of Patent: May 12, 2015

(54) METHOD FOR SPATIALLY MULTIPLEXING TWO OR MORE FRINGE PROJECTION SIGNALS ON A SINGLE DETECTOR

(71) Applicant: Nikon Corporation, Tokyo (JP)

(72) Inventors: Eric Peter Goodwin, Tucson, AZ (US); Daniel G. Smith, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 115 days.

(21) Appl. No.: 13/794,353

(22) Filed: Mar. 11, 2013

(65) Prior Publication Data

US 2013/0308140 A1 Nov. 21, 2013

Related U.S. Application Data

(60) Provisional application No. 61/647,324, filed on May 15, 2012.

(51) Int. Cl.
*G01B 9/02* (2006.01)
*G01B 11/14* (2006.01)
*G01B 11/06* (2006.01)
*G03F 9/00* (2006.01)

(52) U.S. Cl.
CPC ............ *G01B 11/14* (2013.01); *G01B 11/0608* (2013.01); *G01B 2210/56* (2013.01); *G03F 9/7049* (2013.01); *G03F 9/7088* (2013.01)

(58) Field of Classification Search
CPC .............. G01B 11/0608; G01B 11/14; G01B 2210/56; G01B 9/02022; G01B 9/02; G02B 26/106; G02B 26/0883
See application file for complete search history.

(56) References Cited

U.S. PATENT DOCUMENTS

| | | | | |
|---|---|---|---|---|
| 5,596,413 | A * | 1/1997 | Stanton et al. | 356/401 |
| 6,421,179 | B1 * | 7/2002 | Gutin et al. | 359/572 |
| 6,937,343 | B2 * | 8/2005 | Feldman | 356/484 |
| 7,688,426 | B2 * | 3/2010 | Smith et al. | 355/77 |
| 2002/0036762 | A1 * | 3/2002 | Nishi | 355/53 |
| 2009/0135437 | A1 | 5/2009 | Smith | |
| 2010/0067021 | A1 | 3/2010 | Danzebrink et al. | |
| 2010/0245829 | A1 | 9/2010 | Goodwin et al. | |
| 2011/0071784 | A1 | 3/2011 | Smith et al. | |
| 2012/0008150 | A1 | 1/2012 | Smith et al. | |
| 2012/0242970 | A1 * | 9/2012 | Smilde et al. | 355/77 |

FOREIGN PATENT DOCUMENTS

WO WO2012/177663 12/2012

OTHER PUBLICATIONS

International Search Report and Written Opinion for PCT/US2012/043186, dated Sep. 14, 2012, (19 pages).

* cited by examiner

*Primary Examiner* — Kara E Geisel
*Assistant Examiner* — Maurice Smith
(74) *Attorney, Agent, or Firm* — Klarquist Sparkman, LLP (57) ABSTRACT

Fringe patterns at first and second spatial frequencies are projected onto a work piece surface and a reference surface, respectively. An image of the projected fringe patterns is obtained and a measurement signal associated with work piece displacements and a reference signal are obtained based on the first and second spatial frequencies. The image of the projected fringe patterns can exhibit substantial or complete overlap of the fringe patterns at the first and second spatial frequencies, and the overlapping patterns can be separated based on the spatial frequencies. Fringe pattern shifts at one or both of the first and second spatial frequencies can be used to adjust a pattern transfer system to permit accurate pattern transfer.

42 Claims, 10 Drawing Sheets

METHOD FOR SPATIALLY MULTIPLEXING TWO OR MORE FRINGE PROJECTION SIGNALS ON A SINGLE DETECTOR

CROSS REFERENCE TO RELATED APPLICATION

This application claims the benefit of U.S. Provisional Application 61/647,324, filed May 15, 2012, which is incorporated herein by reference.

FIELD

The disclosure pertains to autofocus systems for lithography.

BACKGROUND

Exposure apparatus are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, a measurement system, and a control system. The measurement system monitors the position of the reticle and the wafer, and the control system controls each stage assembly to adjust the positions of the reticle and the wafer. Because the features of the images to be transferred from the reticle onto the wafer can be extremely small, precise positioning of the wafer and the reticle is critical to the manufacturing of high quality wafers.

In certain designs, measurement systems include an autofocus system that is used to map the height of the wafer surface along an optical axis prior to exposing the wafer. Subsequently, with information regarding the position along the optical axis, the wafer stage assembly can be controlled to properly position the wafer along the optical axis.

In one type of autofocus system, a fringe pattern is projected onto a substrate, and shifts of the fringe pattern can be used to estimate substrate displacements along the optical axis so that focus errors can be corrected during exposure. The fringe pattern can be generated by irradiating a diffraction grating and imaging the diffraction grating onto the substrate. After exiting the diffraction grating, a $0^{th}$ order diffraction component can be blocked, while components associated with +1 and −1 diffraction orders are transmitted to the substrate. Typically, the fringe pattern projected onto the substrate is imaged onto a detector such as a focal plane array detector, and lateral shifts of the fringe pattern on the detector are used to generate a focus adjustment. Such autofocus systems are described in Smith et al., U.S. Patent Application Publication 2012/008150, Smith et al., U.S. Patent Application Publication 2011/0071784, and Sogard et al., PCT International Publication No. 2012/177663, all of which are incorporated herein by reference.

In addition to providing focus adjustments, such systems can provide fringe-pattern-based reference signals that can be used to determine substrate shifts or apparent shifts that are unrelated to surface topography or height variations. As described in the Smith et al. references cited above, systems that provide both surface height-based focus signals and reference signals use fringe patterns that are imaged onto different areas of a common detector. Unfortunately, limiting a reference signal or height signal to a portion of a detector can limit signal sensitivity and decrease signal to noise ratio. For these reasons, improved methods and systems for distinguishing topography-based signals from reference signals are needed.

SUMMARY

Overlapping fringe patterns associated with a work piece surface and a reference surface at a detector can be identified based on corresponding fringe pattern spatial frequencies. Fringe projection signals associated with the work piece surface can correspond to sine waves in a narrow frequency range and signal contributions outside of this narrow frequency range can be filtered using hardware or software filters.

Methods and apparatus are disclosed that provide fringe patterns at different spatial frequencies for a work piece and a reference surface. In some examples, these fringe patterns overlap at a detector, and are distinguished by a control system based on their different spatial frequencies. In a representative example, a fringe projector is configured to provide a first fringe pattern to a work piece and a second fringe pattern to a reference surface. Alternatively, fringe patterns having different frequencies can be projected onto a common location using the same or different wavelengths. A detector is configured to produce a work piece measurement signal associated with a spatial frequency corresponding to the first fringe pattern, and a reference signal associated with a spatial frequency corresponding to the second fringe pattern, wherein the work piece and reference spatial frequencies are different. An optical system is configured to image the first fringe pattern from the work piece and the second fringe pattern from the reference surface to a detector such as a focal plane array. Typically, images of the first and second fringe patterns overlap at least partially or completely at the detector, and a controller is configured to compensate work piece topography or height variations based on the work piece measurement signal and to compensate system errors, air currents, or other effects that can be independent of the work piece based on the reference signal. The controller is generally configured to identify the work piece and reference signals based on associated spatial frequencies. An optical system that is configured to produce an image of a reticle pattern on the work piece is situated along an optical axis, and work piece or other displacements along the optical axis are determined based on fringe shifts or fringe phases at the associated spatial frequencies.

Focus systems comprise a fringe projection system configured to provide a first fringe pattern associated with a first diffraction grating period and a second fringe pattern associated with a second diffraction grating period to a first surface and a second surface, respectively. A detector assembly is configured to receive an optical signal associated with the first fringe pattern and the second fringe pattern at a common detector area, and produce a detected fringe signal corresponding to the first grating period and the second grating period. In some examples, a segmented diffraction grating has a first grating segment and a second grating segment, wherein the first grating segment is associated with the first grating period and the second grating segment is associated with the second grating period. In other examples, a compound diffraction grating defines the first grating period and the second grating period in a common area of the compound grating. In representative examples, the detector assembly is configured to produce detected fringe signals associated with the first grating period and the second grating period, and a focus controller is configured to produce a focus adjustment signal based on the detected fringe signals. In typical embodiments, the first surface is a work piece surface and the second surface is a reference surface such that the detected fringe signals include a work piece signal and a reference signal.

In some alternatives, the first grating period and the second grating period are along non-parallel directions or along parallel directions. If the first and second grating periods are along different directions, the first and second grating periods can be the same. In some specific examples, the first fringe pattern is associated with irradiation in a first wavelength range and the second fringe pattern is associated with irradiation in a second wavelength range. In other examples, the first diffraction grating period and the first wavelength range are configured to produce diffraction angles that are substantially the same as diffraction angles based on the second diffraction grating period and the second wavelength.

In some additional embodiments, a prism or a reflector is configured to direct at least one of the first fringe pattern or the second fringe pattern to the common detector area. In some examples, a first prism or a first reflector and a second prism or a second reflector are configured to direct the first fringe pattern and the second fringe pattern, respectively, to the common detector area. The fringe projection system includes an aperture plate or spatial filter configured to select two diffraction orders, such as 0 and +1, −1 and +3, or other combinations. In some embodiments, +1 and −1 diffraction orders associated with at least one of the first diffraction grating period or the second diffraction grating period are selected, and an optical deflector is configured to direct at least one of the first fringe pattern or the second fringe pattern to the common detector area and to the first surface or the second surface, respectively. In some examples, a first optical deflector and a second optical deflector are configured to direct the first fringe pattern and the second fringe pattern to the common detector area and to the first surface and the second surface, respectively. In typical examples, a first optical deflector and a second optical deflector are configured to direct the first fringe pattern and the second fringe pattern from the first surface and the second surface, respectively, to the common detector area.

In additional examples, the fringe projection system includes an aperture plate configured to select +1 and −1 diffraction orders associated with the first diffraction grating period and the second diffraction grating period. A first input optical deflector and a second input optical deflector are configured to direct the first fringe pattern and the second fringe pattern from the aperture plate to the first surface and the second surface, respectively. A first output optical deflector and a second output optical deflector are configured to direct the first fringe pattern and the second fringe pattern from the first surface and the second surface, respectively, to the common detector area.

Methods comprise detecting projected fringe patterns associated with a first spatial frequency and a second spatial frequency at a common area of a detector, and identifying at least one fringe pattern portion associated with at least one of the first spatial frequency or the second spatial frequency based on a detector signal associated with the common area. Based on the identified fringe pattern portion, a work piece displacement is estimated. In some examples, detected fringe pattern portions associated with the first spatial frequency and the second spatial frequency are identified, and the displacement of the work piece is determined based on the identified fringe pattern portions. In some examples, the displacement is a displacement from a focus position, and at least one of the focus position or a work piece position is adjusted based on the identified fringe pattern portions. In some embodiments, the fringe patterns associated with the first spatial frequency and the second spatial frequency are projected along parallel axes to a reference surface and a work piece surface. According to some examples, at least one of the projected fringe patterns is diverted from the parallel axes so as to overlap at the common detector area. In other embodiments, the fringe patterns are projected along non-parallel axes. In some examples, at least one of the projected fringe patterns is received from the reference surface or the work piece surface and diverted from the parallel axes to the common detector area. In some examples, the non-parallel axes are selected so that the projected fringe patterns overlap at the common detector area.

Pattern transfer apparatus comprise a reticle holder configured to retain a reticle that defines at least one pattern to be transferred. An optical system is configured to image the at least one pattern at a focal surface and a work piece holder is configured to retain a work piece at the focal surface. A focus system is configured to adjust a work piece holder location or a focal surface location so as to focus the image of the at least one pattern at the work piece based on identifying at least first and second spatial frequency components in an overlapping area of a projected fringe pattern. In some examples, the focus system is configured to provide a first fringe pattern at the first spatial frequency to a reference surface and a second fringe pattern at the second spatial frequency to a work piece surface. Typically, the first and second spatial frequencies are associated with first and second grating pitches of a diffraction grating that are associated with a common diffraction grating area or grating segments.

These and other features are set forth in detail below with reference to the accompanying drawings.

DETAILED DESCRIPTION

As used in this application and in the claims, the singular forms "a," "an," and "the" include the plural forms unless the context clearly dictates otherwise. Additionally, the term "includes" means "comprises."

The described systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

For convenience, optical fluxes can be described as propagating along one or more axes. Such axes generally are based on one or more line segments so that an axis can include a number of non-collinear segments as the axis is bent or folded or otherwise responsive to mirrors, prisms, lenses, and other optical elements. Optical radiation as used herein generally refers to electromagnetic radiation at wavelengths between about 100 nm and 10 μm, but other ranges can be used. In some cases, visible radiation at wavelengths between about 400 nm and 700 nm is used, but infrared, near infrared, ultraviolet, or other ranges and combinations of ranges can be used.

As used herein, fringe projection refers to the generation of fringes at a target surface, typically by overlapping −1 and +1 diffraction orders produced by irradiation of a diffraction grating with an optical beam from a laser, LED, or other source. For convenience in the following description, the term projected fringes is also used to refer to the propagation of beams that produce such fringes, including locations at which fringes are not formed. The term optical deflector includes mirrors or other reflectors, prisms or other refractive optical elements, holographic, or other optical elements that alter a direction of propagation of an optical beam. An aperture plate refers to a device that permits selection of diffraction orders by transmission (such as through an aperture), or reflection (such as reflection from a reflective surface), or other optical elements that perform similar functions. In some examples, fringes can be projected in different states of polarization if desired.

Figure 1A:
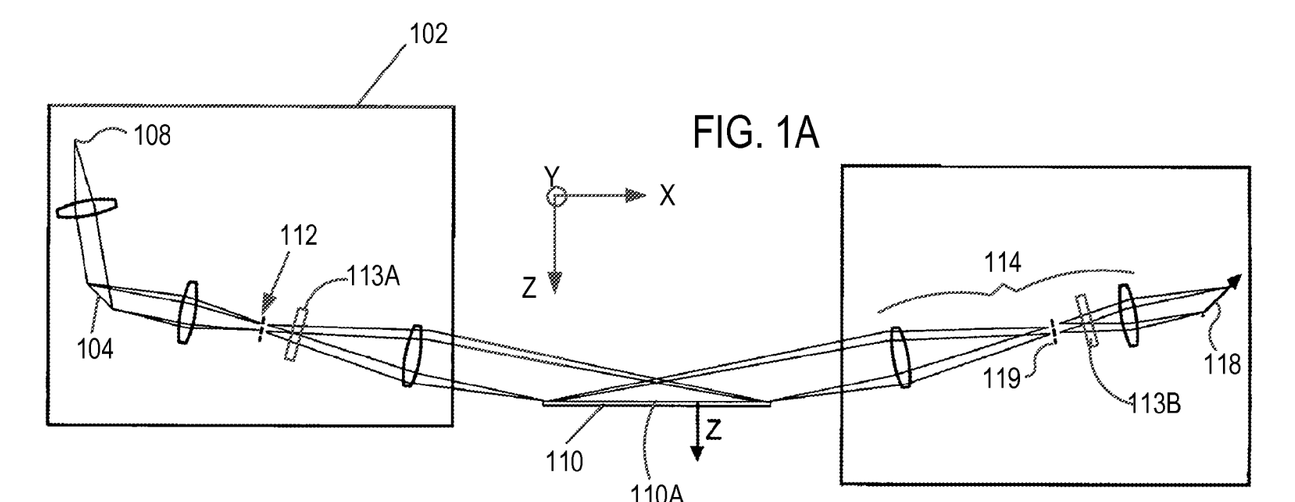
FIG. 1A is a schematic diagram of a portion of an autofocus system based on projected fringes associated with different measurement and reference spatial frequencies.

With reference to FIG. 1A, a fringe projection system 102 comprises a segmented grating 104 that is illuminated by a collimated beam from one or more light sources such as a representative light source 108. In some examples, the light source 108 comprises one or more LEDs that are configured to emit optical radiation in one or more wavelength ranges. The segmented grating 104 typically includes at least a first grating segment and a second grating segment associated with different grating periods, and situated side by side along a y-direction. The grating segments produce +1 and −1 diffracted order beams for each source, and the fringe projection system 102 is configured to direct the +1 and −1 order beams onto a substrate 110. An aperture stop 112 is situated so as to block the $0^{th}$ order diffracted beams from the grating segments so that the $0^{th}$ order beams are not directed to the substrate 110. The sources 108 are preferably non monochromatic sources, each of which produces a beam that irradiates the segmented grating 104. A fringe relay optical system 114 can be configured to image a surface 110A of the substrate 110 onto a detector 118 and a reference surface 111A of a reference structure 111 onto the detector 118 as shown in FIGS. 1B-1C.

Fringe patterns associated with each of the grating segments can be projected onto the wafer surface 110A, the reference surface 111A, or other surfaces. The fringe patterns are directed to or re-imaged onto one or more areas of the detector 118. The detector 118 is coupled to a control system (not shown in FIG. 1A) that can determine fringe shifts at spatial frequencies associated with the first and second grating periods, and store the fringe shifts for use in focus adjustments as the substrate 110 is scanned during pattern transfer. Alternatively, focus adjustments can be determined during scanning.

As shown in FIG. 1A, an aperture 112 is situated to transmit the +1 and −1 diffraction orders for both grating segments. At the aperture 119, the diffraction orders for the first and second grating segments are displaced based on their respective grating periods. Mirror 113A, 113B (or lenses, diffraction gratings or other optical elements) can be provided to direct the diffraction orders for the first grating segment to overlap the diffraction orders for the second grating segment at the substrate 110 and/or the detector 118. As a result, fringes associated with the first and second grating segments are projected onto a common area of the detector 118. The detector is coupled to provide a corresponding image signal (or store a representation of the projected fringes), and spatial frequency components associated with each of the grating segments are identified. These components can be used to assess substrate focus position. Similar beam deflections can be produced at the aperture 119.

Figure 1B:
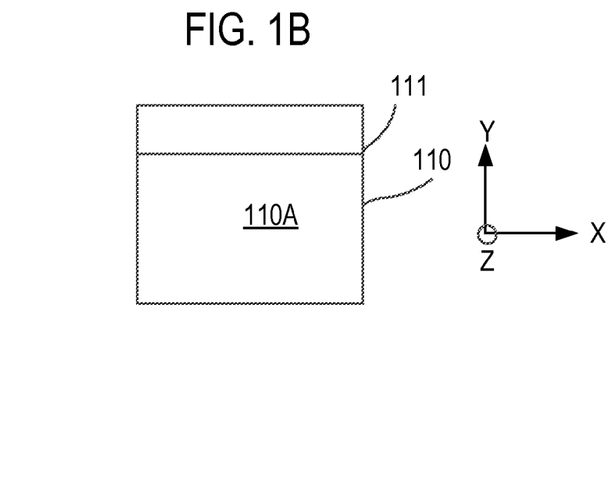
FIGS. 1B-1C illustrate a reference surface.
Figure 1C:
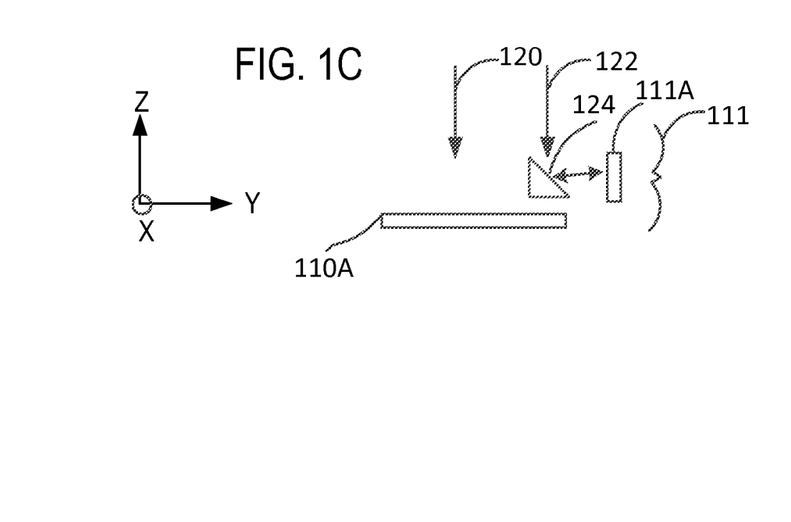

FIGS. 1B-1C further illustrate the arrangement of the substrate 110 and the reference structure 111. FIG. 1A is a plan view of the substrate 110 and FIG. 1B is a sectional view of the substrate 110 and the reference structure 111. A measurement beam 120 associated with the first grating segment is directed to the substrate surface 110A and a reference beam is directed to a mirror 124 that reflects a reference beam 122 to the reference surface 111A.

Figure 2A:
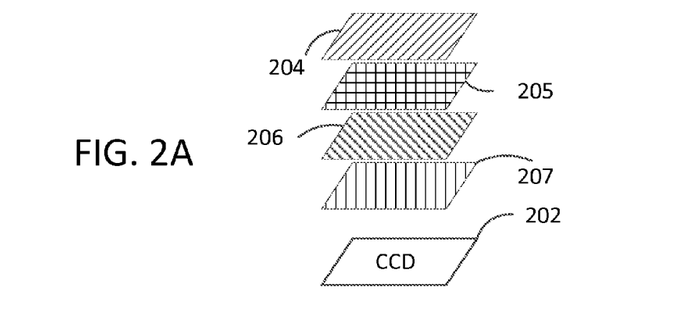
FIG. 2A illustrates overlapping fringe patterns at a detector.

FIG. 2A illustrates fringe projection onto a common detector area. A reference beam having fringes associated with a first spatial frequency is incident to a detector area 202 while measurement beams associated with one or more different spatial frequencies (shown schematically as fringe patterns 204-207) are projected onto the detector area 202. Typically only two fringe patters are used. The detector area can receive optical radiation at a common wavelength or wavelength range, or different wavelengths can be used for some or all the spatial frequencies.

Figure 2B:
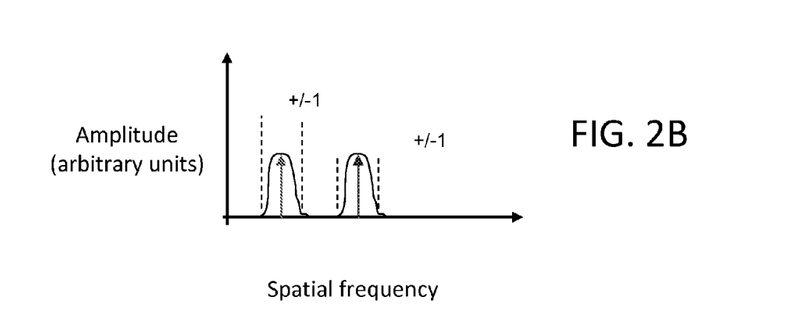
FIG. 2B illustrates a spatial frequency spectrum associated with a combined measurement signal and a reference signal that are overlapping at a detector but are non-overlapping in the spatial frequency domain.

FIG. 2B illustrates frequency spectrum associated with a combined measurement signal and the reference signal. The measurement signal is at a spatial frequency $f_{FPM}$ and the reference signal is at a spatial frequency $f_{FPR}$. In the example of FIGS. 2A-2B the signal portions associated with the measurement and reference fringes are sufficiently spectrally narrow so that there is little or no overlap in the spatial frequency domain. The spatial frequency spectrum can be filtered or otherwise processed to obtain measurement and reference signals that are no longer combined, and the measurement and reference signals can be processed to detect fringe shifts or phase shifts to estimate work piece heights along an imaging optical axis or to estimate system reference changes. It is generally convenient to allow the measurement and reference signals to overlap at the detector, but the differing spatial frequencies of the measurement signal and the reference signal can be used for processing non-overlapping or partially overlapping signals as well. In addition, as shown in FIG. 2B, measurement and reference frequencies are associated with a common spatial direction (e.g., an x-direction or a y-direction with respect to a measurement surface in an xy-plane). In other examples, measurement and reference fringes can be identified based on their associated axes, and a common spatial frequency can be used as a measurement and reference frequency.

Figure 3:
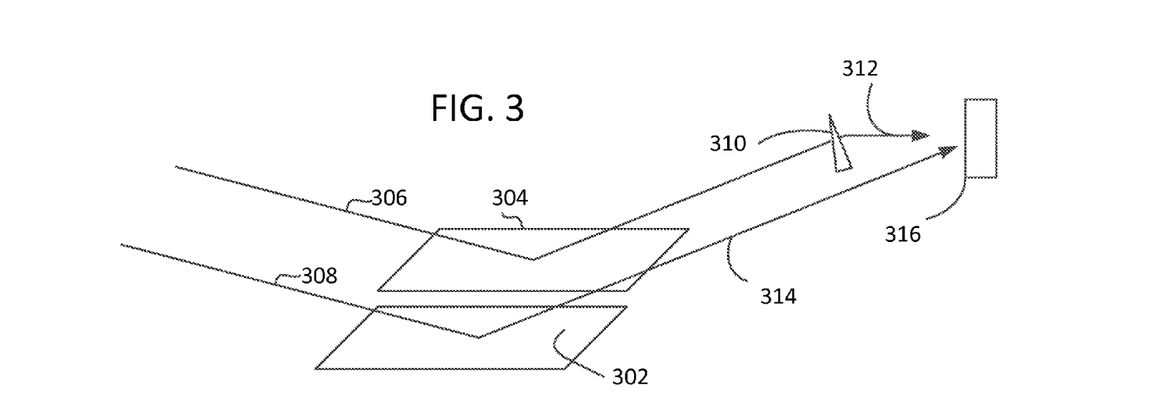
FIG. 3 illustrates directing first and second projected fringe patterns from different surfaces to a common detector area.

FIG. 3 is a schematic representation of a system configured to produce an overlap between first and second fringe patterns having different spatial frequencies. As shown in FIG. 3, a first surface 302 and a second surface 304 are configured to receive projected fringe patterns at first and second spatial frequencies, respectively, along respective axes 306, 308. The fringe patterns are generally based on +1 and −1 diffraction orders of gratings of different periods. One or more wedge prisms such as wedge prism 310 or other optical elements are situated so as to deviate the projected fringe patterns from the surfaces 302, 304 so as to overlap at a detector surface 316. One or both of the fringe patterns can be deviated as may be convenient. As shown in FIG. 3, the axis 306 is redirected by the wedge prism 310 to be along an axis 312.

Figure 4:
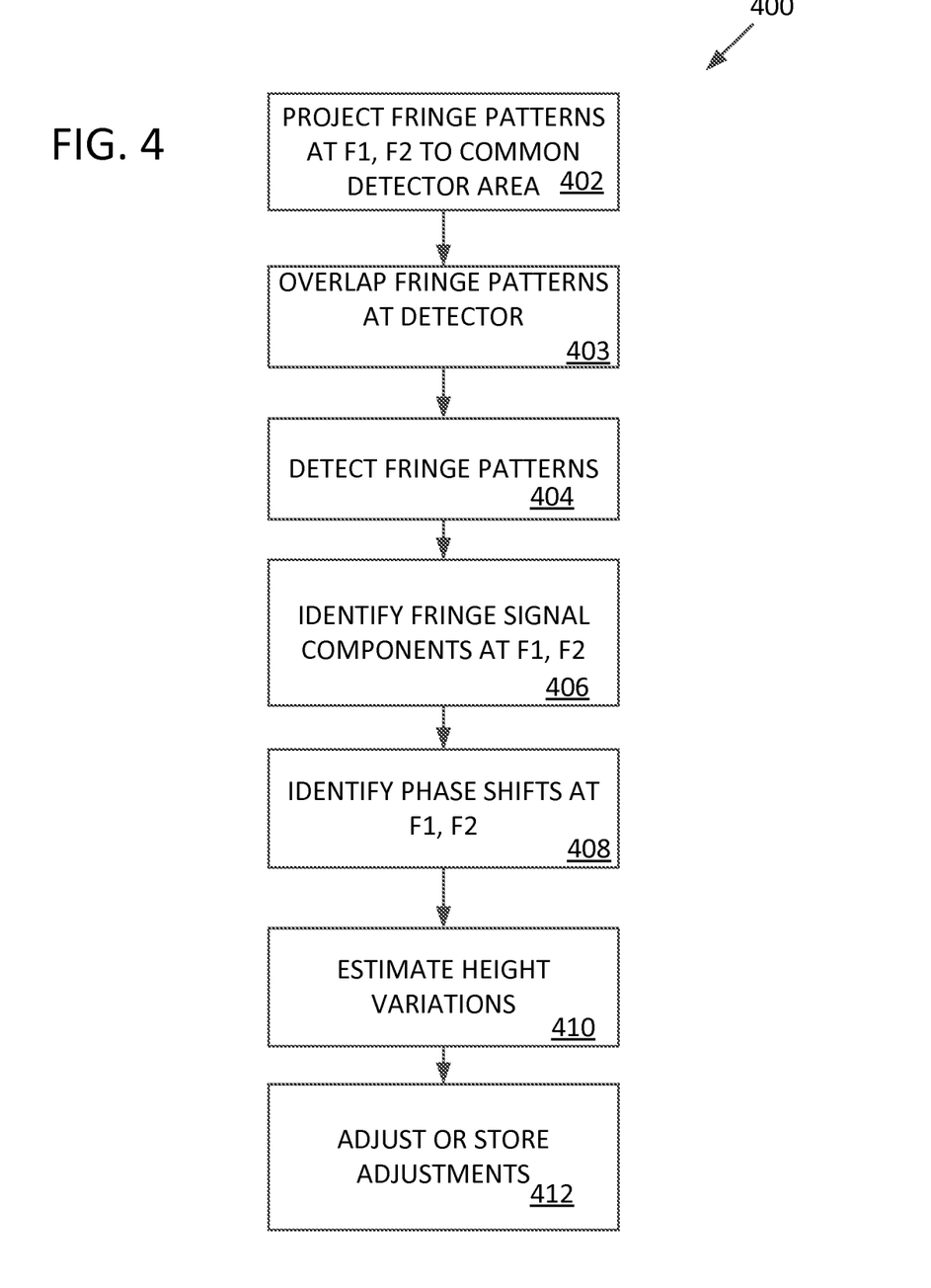
FIG. 4 is a block diagram illustrating a method of obtaining a measurement signal and a reference signal based on a combined measurement/reference signal.

A representative autofocus method 400 is illustrated in FIG. 4. At 402, fringe patterns associated with spatial frequencies $f_1$, $f_2$ are directed onto a wafer surface and a reference surface, respectively. The fringe patterns are then relayed to a common detector area at 403 so as to overlap or partially overlap. At 404, portions of the projected fringe patterns are detected, and at 406, a measurement signal component and a reference signal component are identified based on the spatial frequencies $f_1$, $f_2$. Typically, detection of the projected fringe pattern produces a combined fringe pattern signal which can be processed based on the spatial frequencies $f_1$, $f_2$ to distinguish measurement and reference components. At 408, phase shifts (fringe shifts) associated with one or both of the measurement signal and the reference signal are estimated. At 410, corresponding wafer height variations or reference path variations are estimated based on the phase shifts. At 412, focus or other adjustments can be made. In some examples, a wafer is scanned prior to exposure and fringe shifts are detected so that suitable compensation signals can be stored for use during exposure.

As disclosed herein, fringe projection signals can be sinusoidal or have other spatial frequency spectra with local phase shifts due to height variations of the wafer, and a spectrum of interest of the signal can be limited. If the measurement fringe frequency is $f_{FPM}$ (cycles/mm), then a spectral band of interest can be as small as $f_{FPM}$+/−1 cycle/mm. Frequency components outside of this range can be filtered out by hardware and software. If a reference fringe frequency is $f_{FPR}$, wherein $f_{FPM}$+2 cycle/mm<$f_{FPR}$, then the desired information content of the two signals is fully separated in Fourier space as shown in FIG. 2B above. Measurement and reference fringe spatial frequency differences can be chosen to be larger as well.

In some examples, overlapping measurement and reference fringe patterns can be used to compensate air turbulence that is common to both fringe patterns. In other examples, pixel size variations due to thermal or other effects at a focal plane detector can be compensated so that detector expansion and contraction are not interpreted as work piece displacements or defocus. Typically, measurement and reference fringe patterns are configured to share a common optical path so that common path variations are unlikely to be detected as focus errors. In some examples, the spatial frequency associated with a reference surface is higher than that associated with a measurement (wafer) surface. Lens apertures can be determined based on fringe pitch and a maximum wavelength so as to accommodate the associated diffracted beam. Fringe spatial frequency is determined by grating pitch, and a higher spatial frequency reference signal can be achieved with a finer pitch grating. If such a higher pitch grating is illuminated with a shorter wavelength optical beam, a common lens aperture dimension can be used. For example, if 488 nm illumination from a laser diode or other source is used with a grating having a pitch D, the same lens aperture is needed for illumination of a grating of pitch 2D at a wavelength of 976 nm. Fringe spatial frequencies would then correspond to 1/D and 1/2D, respectively.

Frequency domain side lobes of the reference signal will be set by the flatness of the reference wavefront, which is typically dominated by the aberrations of the lens and the flatness of a reference mirror. These errors are likely lower than 1 cycle/mm in spatial frequency and generally do not produce an overlap with the measurement light in Fourier space. Raw data from a detector can be processed twice; once to extract the measurement signal and a second time to extract the reference signal.

Figure 5A:
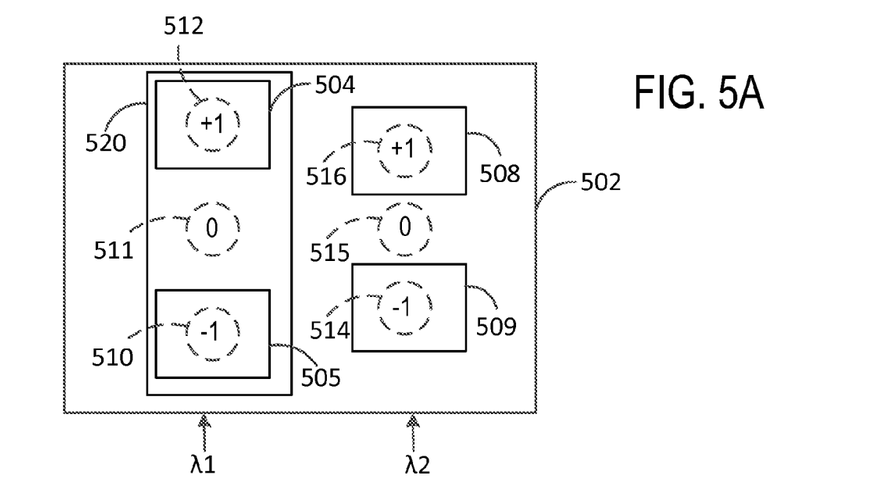
FIGS. 5A-5C illustrate aperture plates that include prism beam deflectors.
Figure 5B:
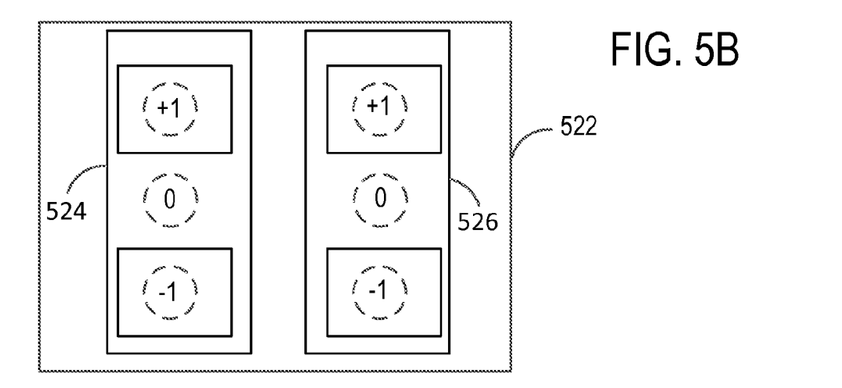
Figure 5C:
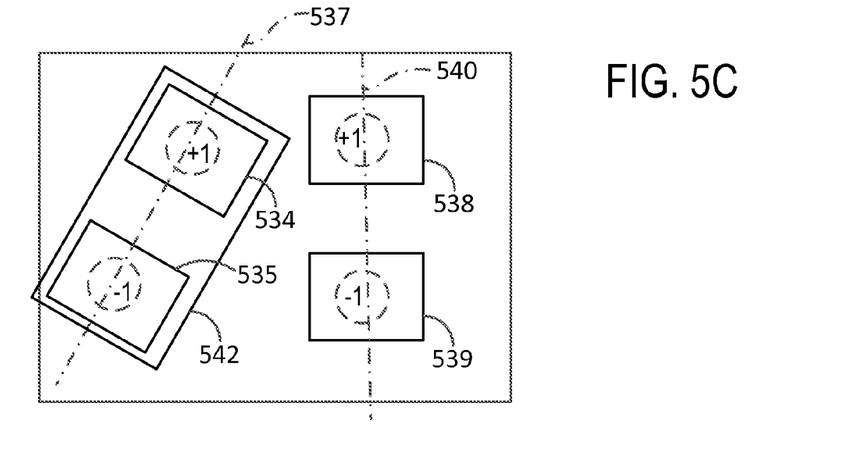

FIGS. 5A-5C schematically illustrate various configurations of aperture stops that can be associated with production of an overlap between reference and measurement beams at a detector. For convenient illustration, higher order diffraction orders which are not used in fringe generation are not shown and elimination of higher diffraction orders is not illustrated.

With reference to FIG. 5A, an aperture plate 502 includes apertures 504, 505 and 508, 509 situated to transmit ±1 diffraction orders associated with respective grating segments and illumination wavelengths. Beam areas of incidence 510-512 are indicated for −1, 0, +1 orders for illumination from a first grating segment, and beam areas of incidence 514-516 are indicated for −1, 0, +1 orders for illumination from a second grating segment. Overlap of fringe patterns can be produced with a prism 520 or other optical element situated so as to redirect the −1, +1 diffraction orders from the first grating segment. In other examples, prisms are situated to redirected the −1, +1 diffraction orders associated with both grating segments. As shown in FIG. 5A, the diffraction orders associated with first and second grating segments have different displacements. A similar aperture plate 522 is shown in a FIG. 5B, but with illumination wavelengths and grating segment pitches configured to produce a common separation of +1,−1 diffraction orders. Prisms 524, 526 are provided to redirect diffraction orders for both grating segments. As shown in FIG. 1, an input side aperture (112) and an output side aperture (119) are optically conjugate, and aperture plates such as those of FIGS. 5A-5C can be situated optically prior to a work surface, optically after the work surface, or at both locations.

In FIG. 5C, apertures 534, 535 are situated along an axis 537 that is tilted with respect to an axis 540 associated with apertures 538, 339. Such an arrangement can be appropriate if the grating segments are illuminated along non-parallel axes and a prism 542 is situated to redirect the −1, +1 diffraction orders.

In FIGS. 5A-5C, apertures are illustrated as rectangular, and a separate aperture is provided for each diffraction order. It can be more convenient to provide apertures that are associated with multiple diffraction orders. For example, apertures 504, 508 can be combined in a single slit or rectangular aperture. Apertures can also be defined based on transmissive, reflective, or absorptive areas.

Figure 6:
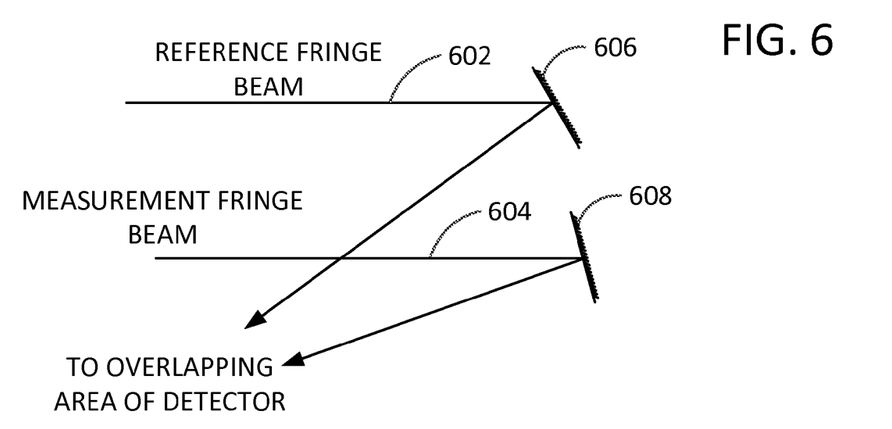
FIG. 6 illustrates mirrors situated to deflect reference and measurement beams so as to overlap at a detector.

Referring to FIG. 6, a reference beam 602 that produces fringes associated with a reference surface and a measurement beam 604 that produces fringes associated with a work piece surface are redirected by reflective surfaces 606, 608 so as to be incident to a common area on a detector. Such reflective surfaces can be situated before and/or after one or both of the reference and measurement beams reach the reference surface or the work piece surface. In other alternatives, combinations of reflective, refractive, holographic, or other optical elements can be used in one or both of the reference and the measurement beams.

In some examples, grating segments of differing pitches are associated with reference and measurement beams and the associated reference and work piece surfaces. Typically, such grating segments correspond to different grating areas that are defined by the differing grating pitches. In other examples, a single grating area can be defined by grating pitches of two or more spatial frequencies in a compound grating.

Figure 7:
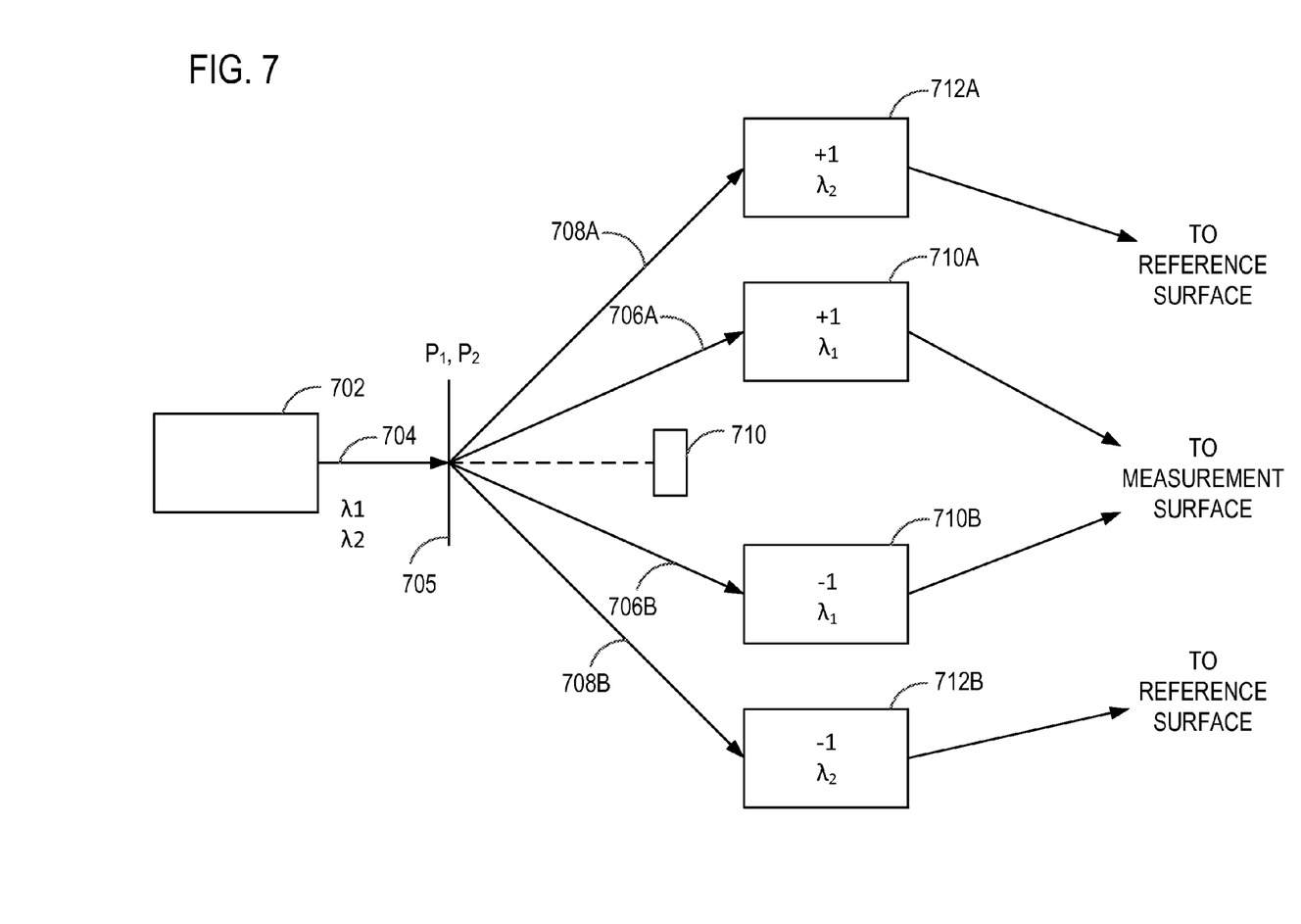
FIG. 7 illustrates a fringe projection system that includes beam deflectors for +1 and −1 diffraction orders.

For example, as shown in FIG. 7, dual wavelength beam 704 from a source 702 is directed to a dual pitch (compound) diffraction grating 705 that is defined by overlapping grating pitches $P_1, P_2$. The dual wavelength beam is diffracted into ±1 diffraction orders 706A, 706B associated with a first wavelength $\lambda_1$ and the first grating pitch $P_1$, and ±1 diffraction orders 708A, 708B associated with a second wavelength $\lambda_2$ and the second grating pitch $P_2$. Higher diffraction orders and diffraction of the first and second wavelengths by the grating pitches $P_2$ and $P_1$, respectively, are not shown. The higher order grating orders are typically blocked. Alternatively, single wavelength illumination can be used and ±1 diffraction orders associated with diffraction by both grating pitches $P_1$, $P_2$ can be used. Optical elements 712A, 712B are situated to overlap the diffraction orders associated with $\lambda_1$ at the reference surface and optical element 710A, 710B are situated to overlap the diffraction orders associated with the measurement surface. The optical elements 710A, 710B, 712A, 712B can be refractive, reflective or holographic elements. FIG. 7 illustrates separation of the reference and measurement beams prior to directing the reference and measurement beams to the reference and work piece surfaces, and the beams from the respective surfaces can be recombined in a similar fashion to as to overlap at a detector.

Figure 8:
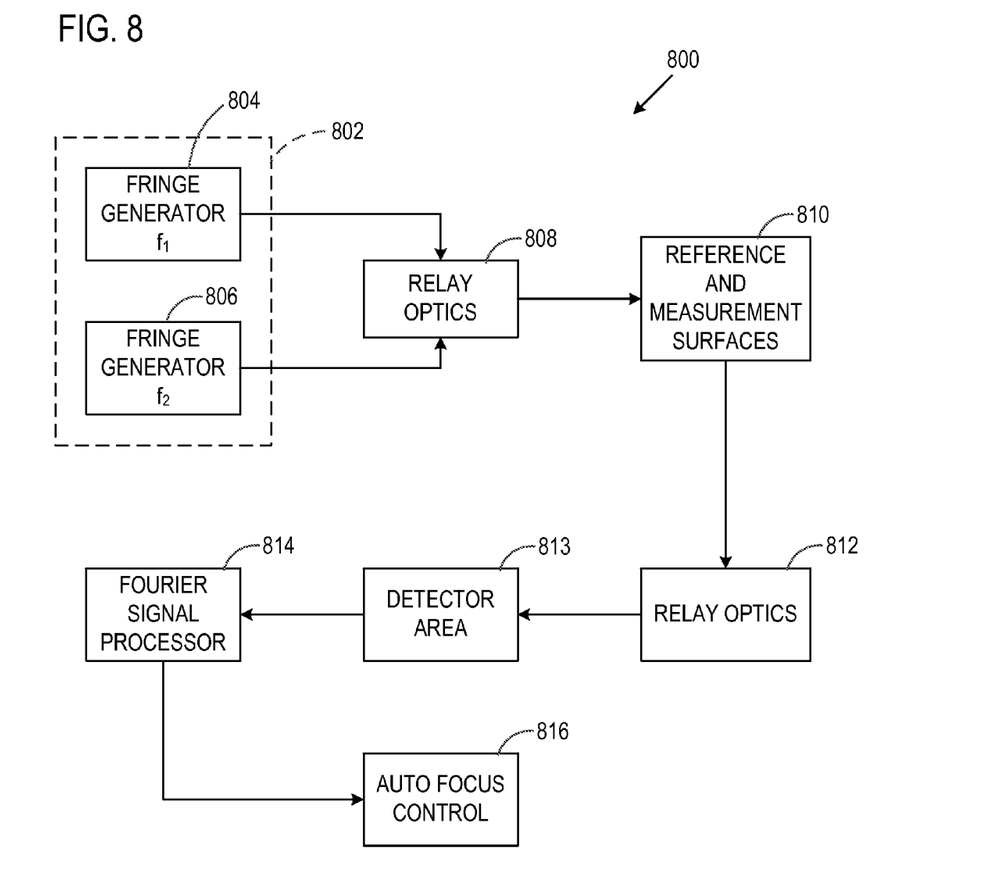
FIG. 8 is a schematic diagram of a representative autofocus system based on detected fringe signals from a common detector area.

FIG. 8 illustrates are representative measurement system 800 that includes a fringe beam generator 802 that is configured to provide optical beams that produce fringes at spatial frequencies $f_1, f_2$. In one example, the fringe beam generator includes fringe beam generators 804, 806 for spatial frequencies $f_1, f_2$, respectively. The fringe beam generators 804, 806 can include optical beam sources, gratings, or grating segments. In some examples, one or more optical wavelengths and segmented or compound gratings are used. A first relay optical system 808 is configured to direct fringe beams to reference and measurement surfaces 810. These surfaces can include multiple reference and multiple measurement surfaces or surface portions. A second relay optical system 812 is situated to direct the fringe beams from the surfaces 810 so as to overlap at a detector area 813. A Fourier signal processor 814 is coupled to the detector 813 and produces output signals associated with the spatial frequencies $f_1, f_2$. A focus controller 816 is coupled to receive the output signals and generate a focus control signal as needed.

The above examples are generally described with reference to a single measurement beam and a single reference beam based on ±1 diffraction orders that are recombined to provide fringes at a reference surface and a measurement surface. In some examples, multiple reference or measurement beams are used at one or more wavelengths, and some or all such beams can be overlapped or partially overlapped in a common detector area. Fringe patterns associated with different grating pitches are identified, and surface placement determinations are based on the plurality of fringe patterns. In typical examples, such determinations can be used to correct image focus such as to focus an image of patterns defined by a mask on a sensitized silicon wafer or to assess or correct for Goos Hanchen shifts as described in U.S. Patent Application Publication 20012/0008150, which is incorporated herein by reference.

The advantages of this technique are numerous. First, the reference signal need not take pixels or detector area away from the measurement signal, since nearly all the pixels can be used for both reference and measurement signals. Secondly, the mirror setup for steering multiple beams is simpler. In addition, the reference light is incident on the same pixels at the detector as the measurement, so any motion of individual pixels will be measured by the reference beam and can be removed.

Figure 9:
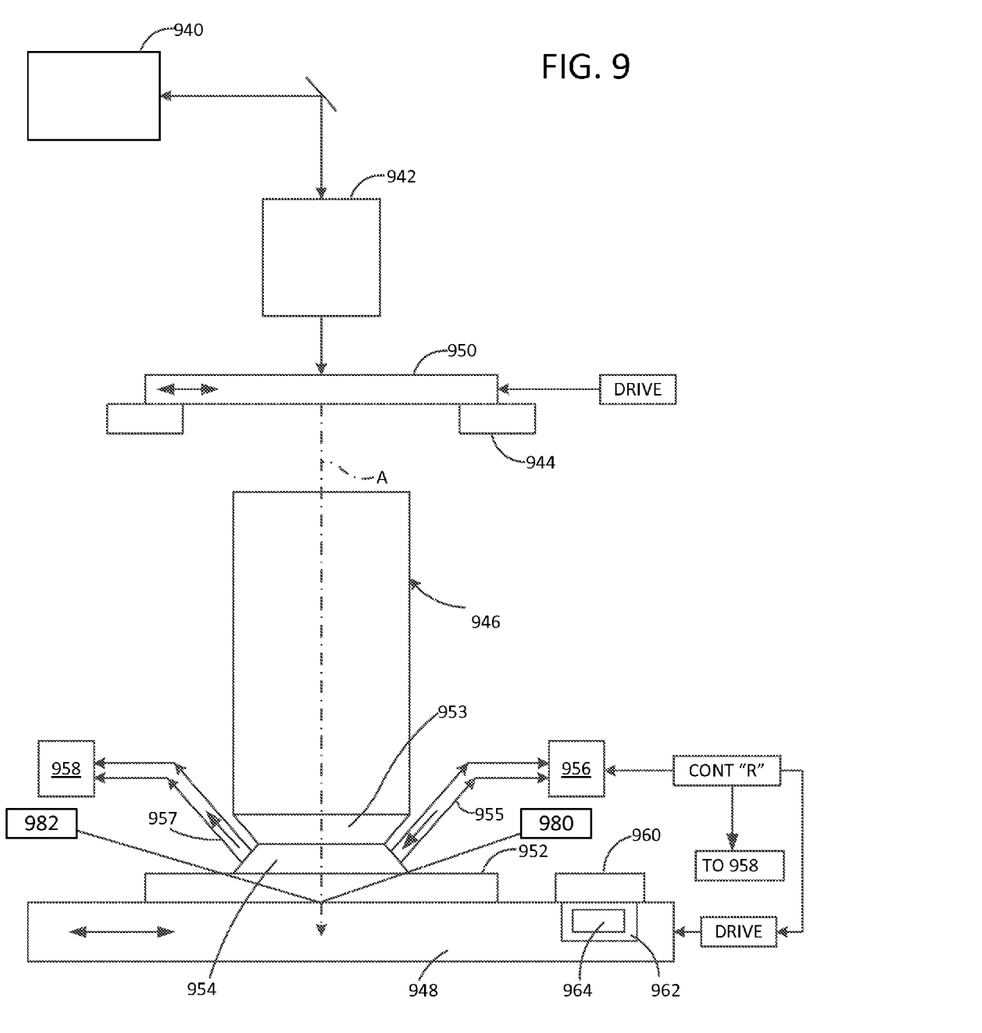
FIG. 9 is a schematic diagram of an immersion microlithography system, which includes an autofocus system as described herein.

The methods and apparatus disclosed above can be used in conjunction with various precision systems such as various types of lithography systems and other wafer processing systems and methods. Turning to FIG. 9, certain features of an immersion lithography system (an exemplary precision system) are shown, namely, a light source 940, an illumination-optical system 942, a reticle stage 944, a projection-optical system 946, and a wafer (substrate) stage 948, all arranged along an optical axis A. The light source 940 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 942 includes an optical integrator and at least one lens that conditions and shapes the illumination beam for illumination of a specified region on a patterned reticle 950 mounted to the reticle stage 944. The pattern as defined on the reticle 950 corresponds to the pattern to be transferred lithographically to a wafer 952 that is held on the wafer stage 948. Lithographic transfer in this system is by projection of an aerial image of the pattern from the reticle 950 to the wafer 952 using the projection-optical system 946. The projection-optical system 946 typically comprises many individual optical elements (not detailed) that project the image at a specified demagnification ratio (e.g., ¼ or ⅕) on the wafer 952. So as to be imprintable, the wafer surface is coated with a layer of a suitable exposure-sensitive material termed a "resist."

The reticle stage 944 is configured to move the reticle 950 in the X-direction, Y-direction, and rotationally about the Z-axis. To such end, the reticle stage is equipped with one or more linear motors having cooled coils as described herein. The two-dimensional position and orientation of the reticle 950 on the reticle stage 944 are detected by a laser interferometer or an encoder system (not shown) in real time, and positioning of the reticle 950 is effected by a main control unit on the basis of the detection thus made.

The wafer 952 is held by a wafer holder ("chuck," not shown) on the wafer stage 948. The wafer stage 948 includes a mechanism (not shown) for controlling and adjusting, as required, the focusing position (along the Z-axis) and the tilting angle of the wafer 952. The wafer stage 948 also includes electromagnetic actuators (e.g., linear motors or a planar motor, or both) for moving the wafer in the X-Y plane substantially parallel to the image-formation surface of the projection-optical system 946. These actuators desirably comprise linear motors, one more planar motors, or both.

The wafer stage 948 also includes mechanisms for adjusting the tilting angle of the wafer 952 by an auto-focusing and auto-leveling method. Thus, the wafer stage serves to align the wafer surface with the image surface of the projection-optical system. The two-dimensional position and orientation of the wafer are monitored in real time by another laser interferometer (not shown). Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 946 normally comprises many lens elements that work cooperatively to form the exposure image on the resist-coated surface of the wafer 952. For convenience, the most distal optical element (i.e., closest to the wafer surface) is an objective lens 953. Since the depicted system is an immersion lithography system, it includes an immersion liquid 954 situated between the objective lens 953 and the surface of the wafer 952. As discussed above, the immersion liquid 954 is of a specified type. The immersion liquid is present at least while the pattern image of the reticle is being exposed onto the wafer.

The immersion liquid 954 is provided from a liquid-supply unit 956 that may comprise a tank, a pump, and a temperature regulator (not individually shown). The liquid 954 is gently discharged by a nozzle mechanism 955 into the gap between the objective lens 953 and the wafer surface. A liquid-recovery system 958 includes a recovery nozzle 957 that removes liquid from the gap as the supply 956 provides fresh liquid 954. As a result, a substantially constant volume of continuously replaced immersion liquid 954 is provided between the objective lens 953 and the wafer surface. The temperature of the liquid is regulated to be approximately the same as the temperature inside the chamber in which the lithography system itself is disposed.

Also shown is a sensor window 960 extending across a recess 962, defined in the wafer stage 948, in which a sensor 964 is located. Thus, the window 960 sequesters the sensor 964 in the recess 962. Movement of the wafer stage 948 so as to place the window 960 beneath the objective lens 953, with continuous replacement of the immersion fluid 954, allows a beam passing through the projection-optical system 946 to transmit through the immersion fluid and the window 960 to the sensor 964.

A fringe projection system 980 is situated to project fringes to the wafer 952 and a reference surface, and a detection system 982 is configured to detect a portion of the fringe pattern. The detected beam can be used as described above to assess focus so that suitable system adjustments can be made to correct, prevent, or at least partially compensate focus shifts.

The present embodiments are also applicable to the AF sensor in liquid immersion type exposure apparatus, for example, as disclosed in U.S. Patent Application Publication No. 2011/0086315.

Furthermore, the above embodiments can also be used in combination with an AF sensor configured to reduce errors due to reflecting surfaces as disclosed, for example, in U.S. Patent Application Publication No. 2009/0116039, and U.S. Pat. No. 8,149,382.

Further, in the embodiments above, a light transmissive type mask (reticle) is used, which is obtained by forming a predetermined light-shielding pattern (or a phase pattern or a light-attenuation pattern) on a light-transmitting substrate. Instead of such a reticle, other types of pattern-defining elements can be used. For example, U.S. Pat. No. 6,778,257 discloses an electron mask (which is also called a variable shaped mask, an active mask, or an image generator, and includes, for example, a DMD (Digital Micromirror Device) or other non-emission image displays (spatial light modulators) or the like) on which a light-transmitting pattern, a reflection pattern, or an emission pattern is formed based on electronic pattern data. In the case of such a variable shaped mask, a stage on which a work piece, such as a glass plate or the like is mounted, is scanned relative to the variable shaped mask, and therefore the equivalent effect to the embodiments above can be obtained by measuring the position of this work piece using the focus system.

Further, as disclosed in, for example, PCT International Publication No. 2001/035168, the embodiment above can also be applied to an exposure apparatus (a lithography system) in which line-and-space patterns are formed on wafer by forming interference fringes on the substrate 110.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

An object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to exposure apparatus used for manufacturing semiconductor devices, but the embodiments above can be widely applied also to, for example, exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiments above can also be applied to exposure apparatus that transfer a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

The focus system and exposure apparatus according to the foregoing embodiments are manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. In addition, there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

The disclosures of all publications, PCT International Publications, U.S. patent application Publications and the U.S. patents that are cited in the description are incorporated herein by reference.

Figure 10:
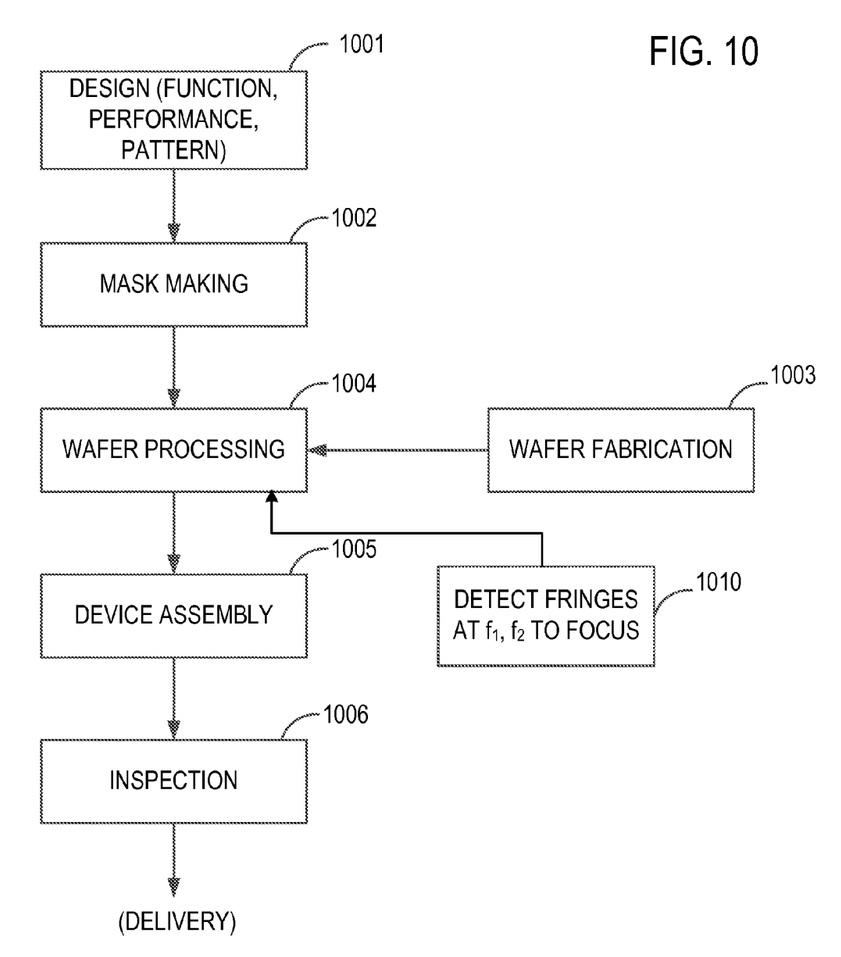
FIG. 10 is a process-flow diagram depicting exemplary steps associated with a process for fabricating semiconductor devices.

Semiconductor devices can be fabricated by processes including microlithography steps performed using a microlithography system as described above. Referring to FIG. 10, in step 1001 the function and performance characteristics of the semiconductor device are designed. In step 1002 a reticle ("mask") defining the desired pattern is designed and fabricated according to the previous design step. Meanwhile, in step 1003, a substrate (wafer) is fabricated and coated with a suitable resist. In step 1004 ("wafer processing") the reticle pattern designed in step 1002 is exposed onto the surface of the substrate using the microlithography system. In a step 1010, reticle/wafer focus errors can be estimated and corrected during exposure. In step 1005 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 1006 the assembled devices are tested and inspected.

Figure 11:
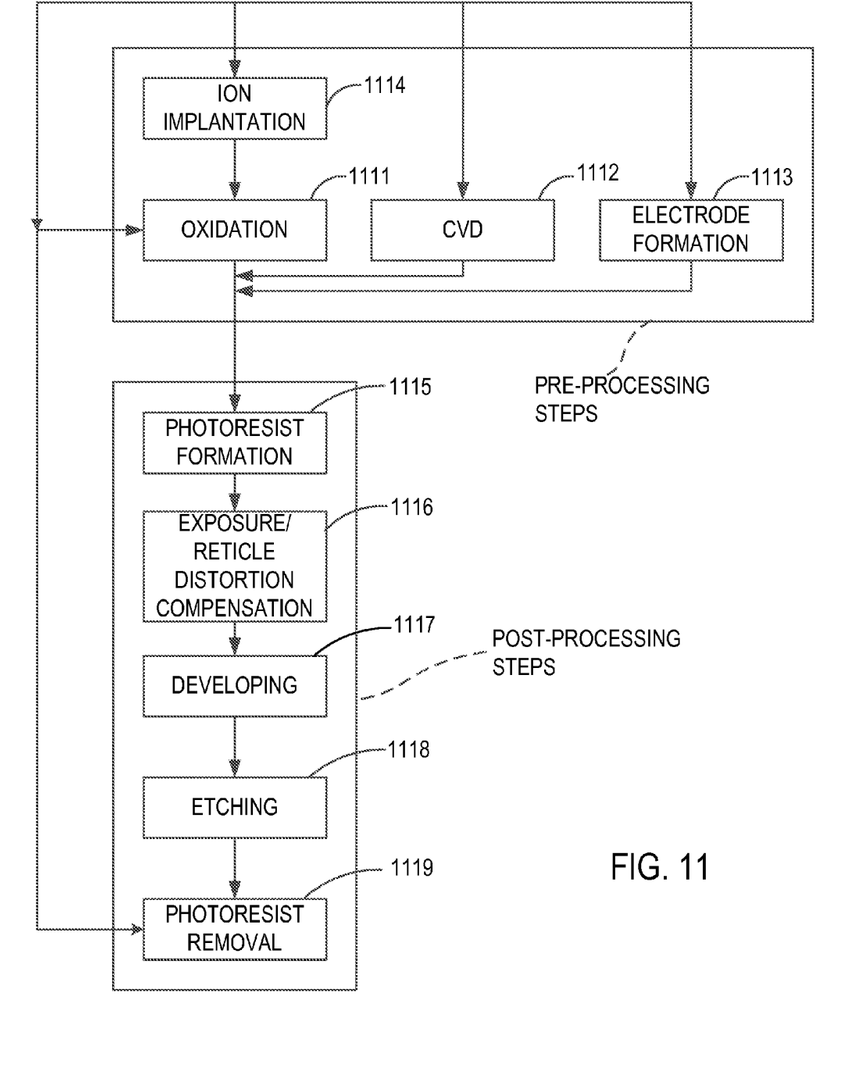
FIG. 11 is a process-flow diagram depicting exemplary steps associated with a processing a substrate (e.g., a wafer), as would be performed, for example, in the process shown in FIG. 10.

Representative details of a wafer-processing process including a microlithography step are shown in FIG. 11. In step 1111 ("oxidation") the wafer surface is oxidized. In step 1112 ("CVD") an insulative layer is formed on the wafer surface by chemical-vapor deposition. In step 1113 (electrode formation) electrodes are formed on the wafer surface by vapor deposition, for example. In step 1114 ("ion implantation") ions are implanted in the wafer surface. These steps 1111-1114 constitute representative "pre-processing" steps for wafers, and selections are made at each step according to processing requirements.

At each stage of wafer processing, when the pre-processing steps have been completed, the following "post-processing" steps are implemented. A first post-process step is step 1115 ("photoresist formation") in which a suitable resist is applied to the surface of the wafer. Next, in step 1116 ("exposure"), the microlithography system described above is used for lithographically transferring a pattern from the reticle to the resist layer on the wafer. Reticle distortion can be compensated during pattern transfer. In step 1117 ("developing") the exposed resist on the wafer is developed to form a usable mask pattern, corresponding to the resist pattern, in the resist on the wafer. In step 1118 ("etching"), regions not covered by developed resist (i.e., exposed material surfaces) are etched away to a controlled depth. In step 1119 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

In view of the many possible embodiments to which the principles of the disclosed technology may be applied, it should be recognized that the illustrated embodiments are only preferred examples and should not be taken as limiting. We therefore claim as our invention all that comes within the scope and spirit of the appended claims.

We claim:

1. A system, comprising:
a fringe projection system that includes an aperture plate and an optical deflector and that provides a first fringe pattern associated with a first spatial frequency based on a first diffraction grating period and a second fringe pattern associated with a second spatial frequency based on a second diffraction grating period to a first surface area and a second surface area, respectively; and
a detector that receives an optical signal associated with the first fringe pattern and the second fringe pattern at a common detector area, and produce a detected fringe signal corresponding to the first spatial frequency or the second spatial frequency,
wherein the aperture plate is situated to select +1 and −1 diffraction orders associated with at least one of the first diffraction grating period or the second diffraction grating period, and wherein the optical deflector is situated to direct at least one of the first fringe pattern or the second fringe pattern to the first surface or the second surface, respectively.

2. The system of claim 1, wherein the first surface area and the second surface area are the same surface area.

3. The system of claim 1, wherein the first surface area and the second surface area are different surface areas.

4. The system of claim 1, further comprising a segmented diffraction grating having a first grating segment and a second grating segment, wherein the first grating segment is associated with the first grating period and the second grating segment is associated with the second grating period.

5. The system of claim 1, further comprising a compound diffraction grating, wherein the first grating period and the second grating period are defined in a common area of the compound grating.

6. The system of claim 1, wherein the detector produces detected fringe signals associated with the first grating period and the second grating period.

7. The system of claim 6, further comprising a focus controller that produces a focus adjustment signal based on the detected fringe signals.

8. The system of claim 7, further comprising a focus controller that produces a focus adjustment signal based on the work piece and reference signals.

9. The system of claim 1, wherein the first surface area is a work piece surface area and the second surface area is a reference surface area such that the detected fringe signals include a work piece signal and a reference signal.

10. The system of claim 1, wherein the first grating period and the second grating period are along non-parallel directions.

11. The system of claim 1, wherein the first grating period and the second grating period are along parallel directions.

12. The system of claim 1, wherein the first fringe pattern is associated with a first wavelength range and the second fringe pattern is associated with a second wavelength range.

13. The system of claim 1, wherein the first diffraction grating period and the first wavelength range are situated to produce diffraction angles that are substantially the same as diffraction angles based on the second diffraction grating period and the second wavelength.

14. The system of claim 1, further comprising a prism situated to direct at least one of the first fringe pattern or the second fringe pattern to the common detector area.

15. The system of claim 1, further comprising a first prism and a second prism situated to direct the first fringe pattern and the second fringe pattern, respectively, to the common detector area.

16. The system of claim 1, further comprising a reflector situated to direct at least one of the first fringe pattern or the second fringe pattern to the common detector area.

17. The system of claim 1, further comprising a first reflector and a second reflector situated to direct the first fringe pattern and the second fringe pattern, respectively, to the common detector area.

18. The system of claim 1, wherein the optical deflector includes a first optical deflector and a second optical deflector situated to direct the first fringe pattern and the second fringe pattern to the common detector area and to the first surface area and the second surface area, respectively.

19. The system of claim 1, further comprising a first optical deflector and a second optical deflector situated to direct the first fringe pattern and the second fringe pattern from the first surface area and the second surface area, respectively, to the common detector area.

20. The system of claim 1, further comprising an optical deflector situated to direct at least one of the first fringe pattern or the second fringe pattern from the first surface area or the second surface area, respectively, to the common detector area.

21. The system of claim 1, wherein the optical deflector includes:
a first input optical deflector and a second input optical deflector situated to direct the first fringe pattern and the second fringe pattern from the aperture plate to the first surface area and the second surface area, respectively; and
a first output optical deflector and a second output optical deflector situated to direct the first fringe pattern and the second fringe pattern from the first surface area and the second surface area, respectively, to the common detector area.

22. The system of claim 1, wherein the optical deflector includes:
a first input optical deflector and a second input optical deflector situated to direct the first fringe pattern and the second fringe pattern from the first surface area and the second surface area, respectively, to the aperture plate; and
a first output optical deflector and a second output optical deflector situated to direct the first fringe pattern and the second fringe pattern from the aperture plate, respectively, to the common detector area.

23. The system of claim 1, wherein the first fringe pattern and the second fringe pattern overlap at the common detector area.

24. A method, comprising:
providing a first fringe pattern associated with a first spatial frequency based on a first diffraction grating period and a second fringe pattern associated with a second spatial frequency based on a second diffraction grating period to a first surface area and a second surface area, respectively;
selecting +1 and −1 diffraction orders associated with at least one of the first diffraction grating period or the second diffraction grating period;
directing at least one of the first fringe pattern of the second fringe pattern to a common detector area and to the first surface area or the second surface area, respectively;
detecting projected fringe patterns associated with a first spatial frequency and a second spatial frequency at the common area of a detector; and
identifying at least one fringe pattern portion associated with at least one of the first spatial frequency or the second spatial frequency based on a detector signal associated with the common area; and
based on the identified fringe pattern portion, estimating a displacement of a work piece.

25. The method of claim 24, further comprising identifying detected fringe pattern portions associated with the first spatial frequency and the second spatial frequency, and determining the displacement of the work piece based on the identified fringe pattern portions.

26. The method of claim 25, wherein the displacement is a displacement from a focus position, and further comprising adjusting at least one of the focus position or a work piece position based on the identified fringe pattern portions.

27. The method of claim 24, further comprising projecting the fringe patterns associated with the first spatial frequency and the second spatial frequency along parallel axes to a reference surface and a work piece surface.

28. The method of claim 27, further comprising diverting at least one of the projected fringe patterns from the parallel axes so as to overlap at the common detector area.

29. The method of claim 28, wherein at least one Of the projected fringe patterns is received from the reference surface or the work piece surface and diverted from the parallel axes to the common detector area.

30. The method of claim 28, wherein at least one of the projected fringe patterns is diverted from the parallel axes to the reference surface or the work piece surface.

31. The method of claim 30, wherein the projected fringe patterns are diverted from the parallel axes to the reference surface and the work piece surface.

32. The method of claim 30, wherein the projected fringe patterns are received from the reference surface and the work piece surface and diverted from the parallel axes to the common detector area.

33. The method of claim 24, further comprising projecting the fringe patterns associated with the first spatial frequency and the second spatial frequency along non-parallel axes to a reference surface and a work piece surface.

34. The method of claim 33, wherein the non-parallel axes are selected so that the projected fringe patterns overlap at the common detector area.

35. The method of claim 33, further comprising diverting at least one of the projected fringe patterns from the non-parallel axes so as to overlap at the common detector area.

36. The method of claim 33, further comprising forming the projected fringe patterns by directing optical beams to a first grating segment and a second grating segment.

37. The system of claim 24, wherein the first fringe pattern and the second fringe pattern overlap at the common detector area.

38. A pattern transfer apparatus, comprising:
a reticle holder configured to retain a reticle that defines at least one pattern to be transferred;

an optical system that images the at least one pattern at a focal surface;

a work piece holder that retains a work piece at the focal surface; and a focus system comprising the system of claim 1 that adjusts a work piece holder location or a focal surface location so as to focus the image of the at least one pattern at the work piece based on identifying at least first and second spatial frequency components in an overlapping area of a projected fringe pattern.

39. The pattern-transfer apparatus of claim 38, wherein the focus system provides a first fringe pattern at the first spatial frequency to a reference surface and a second fringe pattern at the second spatial frequency to a work piece surface.

40. The pattern-transfer apparatus of claim 39, further comprising a diffraction grating, and the first and second spatial frequencies are associated with first and second grating pitches of the diffraction grating.

41. The pattern-transfer apparatus of claim 40, where the first and second spatial frequencies are associated with a common area of the diffraction grating.

42. The pattern-transfer apparatus of claim 40, where the first and second spatial frequencies are associated with first and second segments, respectively, of the diffraction grating.

* * * * *